US008045787B2

(12) United States Patent
Choi et al.

(10) Patent No.: US 8,045,787 B2
(45) Date of Patent: Oct. 25, 2011

(54) SYSTEM FOR ANALYZING MASK TOPOGRAPHY AND METHOD OF FORMING IMAGE USING THE SYSTEM

(75) Inventors: Soo-han Choi, Seoul (KR); Yong-jin Chun, Daejeon (KR); Moon-hyun Yoo, Suwon-si (KR); Joon-ho Choi, Suwon-si (KR); Ji-suk Hong, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 962 days.

(21) Appl. No.: 12/006,877

(22) Filed: Jan. 7, 2008

(65) Prior Publication Data

US 2008/0175432 A1 Jul. 24, 2008

(30) Foreign Application Priority Data

Jan. 9, 2007 (KR) .................. 10-2007-0002652

(51) Int. Cl.
*G06K 9/00* (2006.01)
(52) U.S. Cl. ............................. 382/144; 382/100; 703/2
(58) Field of Classification Search .................. 382/144
See application file for complete search history.

(56) References Cited

U.S. PATENT DOCUMENTS 6,893,800 B2   5/2005   Jessen et al.
2004/0122636 A1*  6/2004  Adam ............................... 703/2
2005/0283747 A1   12/2005  Adam
2006/0192149 A1*  8/2006  Van Dam et al. ........ 250/492.22

FOREIGN PATENT DOCUMENTS

KR   10-0598297   7/2006

* cited by examiner

*Primary Examiner* — Brian Q Le
*Assistant Examiner* — Ruiping Li
(74) *Attorney, Agent, or Firm* — Onello & Mello, LLP

(57) ABSTRACT

Provided are a system for analyzing a mask topography, which can reduce calculation time and increase calculation accuracy in consideration of a mask topography effect, and a method of forming an image using the system. The system and method simultaneously obtains a first electric field using a Kirchhoff method without considering a pitch formed on a mask and obtains a second electric field using an electromagnetic field analysis method considering the pitch, and then determines a third electric field on a pupil surface of a projection lens by combining the first electric field and the second electric field of forming an image, so as to calculate the image of an optical lithography system which includes an illumination system and a projection optical system and to which the projection lens belongs.

14 Claims, 11 Drawing Sheets

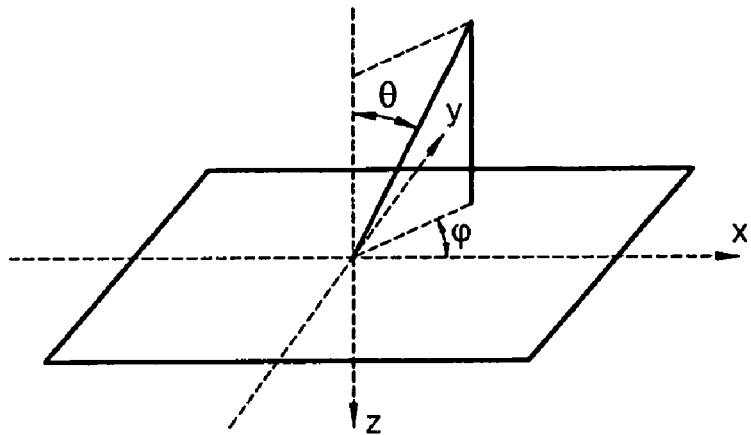

$\hat{e}_{TE} = -\sin\varphi\, \hat{e}_x + \cos\varphi\, \hat{e}_y$ $\hat{e}_{TM} = -\sin\theta\, \hat{e}_x + \sin\theta\cos\varphi\, \hat{e}_y - \cos\theta\, \hat{e}_z$

FIG. 13

$$E' = JE = \begin{bmatrix} J_{xx} & J_{xy} \\ J_{yx} & J_{yy} \end{bmatrix} \begin{bmatrix} E_x \\ E_y \end{bmatrix}$$

FIG. 14

$J = (a_0 + ib_0)\sigma_1 + (a_1 + ib_1)\sigma_2 + (a_2 + ib_2)\sigma_2 + (a_3 + ib_3)\sigma_3$ $$\sigma_0 = \begin{bmatrix} 1 & 0 \\ 0 & 1 \end{bmatrix}$$

$$\sigma_1 = \begin{bmatrix} 1 & 0 \\ 0 & -1 \end{bmatrix}$$

$$\sigma_2 = \begin{bmatrix} 0 & 1 \\ 1 & 0 \end{bmatrix}$$

$$\sigma_3 = \begin{bmatrix} 0 & -i \\ -i & 0 \end{bmatrix}$$

SYSTEM FOR ANALYZING MASK TOPOGRAPHY AND METHOD OF FORMING IMAGE USING THE SYSTEM

CROSS-REFERENCE TO RELATED PATENT APPLICATION

This application claims priority under 35 U.S.C. 119 to Korean Patent Application No. 10-2007-0002652, filed on Jan. 9, 2007, in the Korean Intellectual Property Office, the disclosure of which is incorporated herein in its entirety by reference.

BACKGROUND OF THE INVENTION

1. Field of the Invention

The present invention relates to a system and method for manufacturing a semiconductor device, and more particularly, to a system for analyzing a mask topography and a method of forming an image using the system.

2. Description of the Related Art

In photolithography, as a feature size on a mask becomes smaller than the wavelength of light used to illuminate the mask, the aspect ratio of the thickness of the mask to the feature size becomes higher. Accordingly, it is difficult to accurately simulate a topography of a pattern drawn on the mask (referred to as a "mask topography" hereinafter) using a conventional Kirchhoff method that assumes the mask to be a thin mask without topographic features.

The conventional Kirchhoff method will now be explained with reference to FIGS. 1A and 1B. Light transmitted through a space between light blocking layers 20 disposed on a substrate 10 had no phase change and had a higher transmittance or amplitude-like step function. An interval between the light blocking layers 20 on a 4× mask was 140 nm, and the wavelength of the light was 280 nm. In detail, FIG. 1A illustrates a plot of an amplitude (solid line) and a phase (dotted line) according to a horizontal position or distance in nanometers (nm). The amplitude was constantly high only in an area where the light blocking layers 20 were not formed, and there was no phase change according to the distance. Also, FIG. 1B illustrates an amplitude (arrow) and a phase according to frequency (f) on a pupil surface of a projection lens, wherein zero order light had an amplitude of $a_1$ and ± first order light had an amplitude of $a_2$ without any phase change.

To more accurately simulate a topography, an electromagnetic (EM) field analysis method has been proposed that calculates a transmittance and a phase of an electric field (E-field) on a mask surface considering a mask topography effect.

The conventional EM field analysis method will now be explained with reference to FIGS. 2A and 2B. Light transmitted through a space between light blocking layers 20 disposed on a substrate 10 has an amplitude or transmittance and a phase which are different from those of the conventional Kirchhoff method. Referring to an image 30 of FIG. 2A illustrating an amplitude and a phase and a graph 40 illustrating an amplitude (solid line) and a phase (dotted line) according to a horizontal position or distance, the light had an amplitude shaped like a distorted step function, and a variation in phase such that the phase below the light blocking layer 20 was changed.

Referring to FIG. 2B illustrating an amplitude (arrow) according to frequency (f) on a pupil surface of a projection lens, the amplitudes of zero order light and first order light were higher than their counterparts $a_1$ and $a_2$ of FIG. 1B, respectively. Also, the phase of the first order light was 10° or so. Briefly, a change in the amplitude and the phase of an E-field on a mask surface results in a change in the amplitude and the phase of an E-field of zero order light and first order light on a pupil surface of a projection lens. The change in the amplitude and the phase of the E-field on the pupil surface of the projection lens changes the contrast of an image on a wafer and affects focus tilt. Accordingly, the EM field analysis method can calculate the E-field on the mask surface and thus can accurately predict the image produced on the wafer.

When the E-field on the mask surface is calculated using the EM field analysis method and a mask pattern is a line and space (referred to as L/S) pattern, a calculation time is 1 minute or less. However, when the mask pattern is a complex two-dimensional (2D), pattern, a calculation time is increased exponentially. In particular, it is virtually impossible to calculate a complex 2D pattern in design for manufacturability (DFM) or optical proximity correction (OPC). Accordingly, attempts have been made to reduce a time required to calculate the amplitude or transmittance and the phase of an E-field on a mask surface by using an approximation model instead of the EM field analysis method.

Table 1 shows the characteristics of the conventional Kirchhoff method, the EM field analysis method, and the approximation model. Here, a domain decomposition method (DDM) and a boundary layer method were used as examples of the approximation model. The methods were compared in terms of whether they can calculate a mask topography effect, calculation time, and calculation accuracy.

TABLE 1

| Method | Possibility of calculating mask topography effect | Calculation time (speed) | Calculation accuracy |
|---|---|---|---|
| Kirchhoff | Impossible | 1 time | Poor |
| EM field analysis | Possible | 10~100 time | Good |
| DDM | Possible | 2~5 times | Between good and fair |
| Boundary layer | Possible | 1 time | Fair |

Referring to Table 1, the EM field analysis method had the best calculation accuracy, but had the longest calculation time as, described above. The DDM method had a relatively good calculation accuracy, but had a long calculation time. In terms of the calculation time, the boundary layer method was the best for DFM and OPC. However, it was difficult to implement the boundary layer method and thus desired boundary layers could not be used for various patterns. Also, since the boundary layer method used only one predetermined boundary layer, the calculation accuracy was not high.

SUMMARY OF THE INVENTION

In accordance with the present invention, provided is a system for analyzing a mask topography, which can reduce calculation time and increase calculation accuracy by considering a mask topography effect.

In accordance with the present invention, there is also provided a method of forming an image using the system.

According to an aspect of the present invention, there is provided a system for analyzing a mask topography where an illumination system is configured to transmit light incident on a mask, wherein light passes through the mask to a projection system having a projection lens configured to transmit light to an image surface of a wafer, the system comprising: an initial E-field module configured to determine a first electric field on a mask surface of the mask using a Kirchhoff method, independent of a pitch formed on the mask, and to determine a second electric field on a pupil surface of the projection lens using an electromagnetic field analysis method dependent on the pitch; and a resultant E-field module configured to determine a third electric field on the image surface of the wafer as a combination of the first electric field and the second electric field.

The initial E-field module can be configured to determine the second electric field based on the illumination system comprising a normally incident point light source.

When an angle of incidence of the incident light is small enough not to affect an amplitude and the aspect ratio of a mask thickness to a feature size is low, the initial E-field module can be configured to determine the second electric field based on an assumption that the incidence is a normal incidence.

When an angle of incidence of the incident light is large enough to affect an amplitude and the aspect ratio of a mask thickness to a feature size is high, the initial E-field module can be configured to determine the second electric field based on the assumption that the incidence is an oblique incidence.

An angle of incidence of the incident light can be an oblique incidence and the initial E-field module can be configured to: determine the second electric field based on an assumption that the oblique incidence is normal incidence; and determine the second electric field in the case of the oblique incidence by shifting the second electric field in the case of normal incidence according to a predetermined frequency.

The resultant E-field module can be configured to determine the third electric field by multiplying the second electric field by a Jones matrix or a Pauli matrix when the incident light is polarized light.

The initial E-field module can be configured to determine the second electric field as the electric field of zero order light and first order light on the pupil surface of the projection lens.

The pitch can be the pitch of a line and space pattern of the mask.

The initial E-field module can be configured to determine the second electric field for each of a plurality of pitches and to store the second electric field in a lookup table according to each pitch.

The initial E-field module can be configured to determine the second electric field at each pitch as the electric field of zero order light and first order light on the pupil surface of the projection lens, wherein the lookup table can be configured to store the second electric fields of the zero order light and the first order light according to each pitch, and can include a basic format of f, g, amplitude, and phase.

The lookup table can be written using Jones and Pauli matrices.

The lookup table can be corrected with respect to a critical dimension.

The initial E-field module can be configured to determine an electric field for each of a plurality of pitches by obtaining an amplitude and a phase using a Kirchhoff method for each pitch, and to obtain an amplitude and a phase of the second electric field using an electromagnetic field analysis method with the amplitudes and a phases determined for each pitch.

The initial E-field module can be configured to determine the second electric field for each of a plurality of pitches, to obtain amplitudes and phases for the plurality of pitches, and, if amplitudes and phases cannot be obtained for one or more pitches, to determine the amplitudes and phases for the one or more pitches based on the amplitudes and phases for the other pitches.

The initial E-field module can be configured to determine the second electric field within a cut-off frequency range of the projection lens.

In accordance with another aspect of the invention, provided is a method of analyzing a mask topography in an, optical, lithography system comprising an illumination system configured to transmit light incident on a mask, wherein light passes through the mask to a projection system having a projection lens configured to transmit light to an image surface of a wafer, the method comprising: determining a first electric field by performing a Kirchhoff method on a mask surface of the mask, independent of a pitch formed on the mask, and determining a second electric field on a pupil surface of the projection lens by performing an electromagnetic field analysis using the pitch; and determining a third electric field on the image surface of the wafer as a combination of the first electric field and the second electric field.

The can further comprise determining the intensity of the second E-field by multiplying an integral of the Fourier transform of a mask pattern and an integral of a transmission cross efficient between the illumination system and the projection lens, with the third electric field.

The method can further comprise determining the intensity of the second E-field by multiplying an integral of the first electric field and an integral of a multiplication of the second electric field and the transmission cross coefficient.

The illumination system can include point light sources, and the method can further comprise determining the first and second E-fields by determining an intensity of light for each point source by integrating a multiplication of a time-averaged intensity of a point light source and an electric field of the point light source on the image surface and an electric field of the point light source.

The method can further comprise calculating the second electric field based on the illumination system comprising a normally incident point light source.

When an angle of incidence of the incident light is small enough not to affect an amplitude and the aspect ratio of a mask thickness to a feature size is low, the method can further comprise determining the second electric field based on an assumption that the incidence is a normal incidence.

When an angle of incidence of the incident light is large enough to affect an amplitude and the aspect ratio of a mask thickness to a feature size is high, the method can further comprise determining the second electric field based on an assumption that the incidence is an oblique incidence.

An angle of incidence of the incident light can be an oblique incidence, and the method can further comprise: determining the second electric field based on an assumption that the oblique incidence is a normal incidence; and determining the second electric field in the case of the oblique incidence by shifting the second electric field in the case of normal incidence according to a frequency.

The method can further comprise determining the third electric field by multiplying the second electric field by a Jones matrix or a Pauli matrix when the incident light is polarized light.

The pitch can be the pitch of a line and space pattern of the mask.

The method can further comprise storing the second electric field in a lookup table according to each pitch.

The method can further comprise correcting the lookup table with respect to a critical dimension.

The method can further comprise: determining an electric field for each of a plurality of pitches by obtaining an amplitude and a phase using a Kirchhoff method for each pitch; and obtaining an amplitude and a phase of the second electric field using an electromagnetic field analysis method with the amplitudes and a phases determined for each pitch.

The method can further comprise determining the second electric field within a cut-off frequency range of the projection lens.

The method can comprise forming an image of the mask topography on the image surface of the wafer.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention. In the drawings:

FIG. 12 illustrates TE and TM elements resolved into vectors of the xyz plane;

FIG. 13 is the equation of an E-field on a pupil surface of a projection lens using a Jones matrix; and FIG. 14 is a Pauli matrix obtained by developing the Jones matrix.

DETAILED DESCRIPTION OF THE INVENTION

Figure 1A:
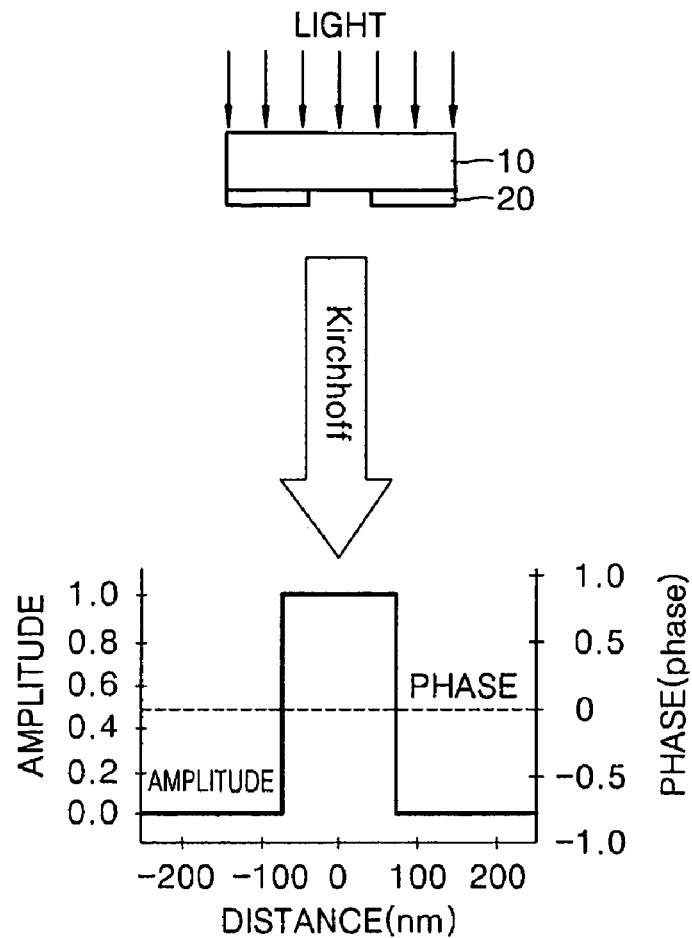
FIG. 1A is a graph illustrating a mask topography of a conventional Kirchhoff method as an amplitude and a phase according to a distance.
Figure 1B:
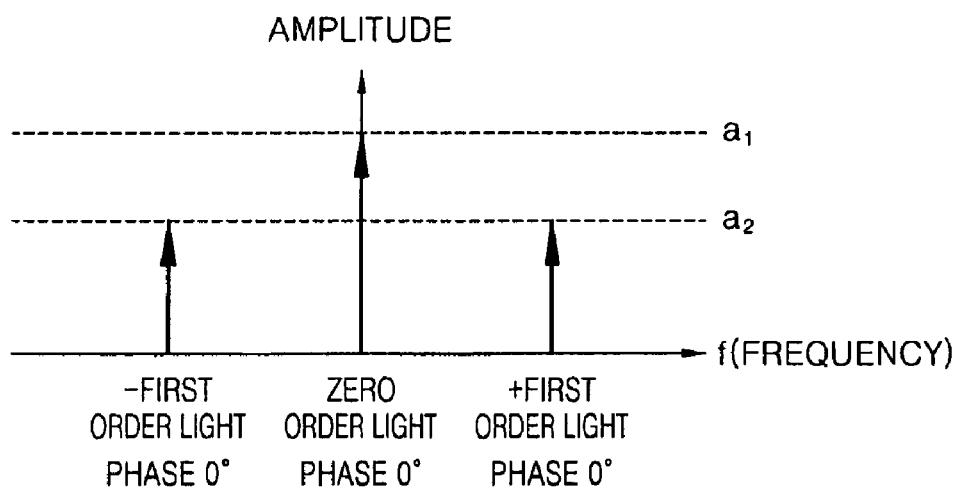
FIG. 1B is a graph illustrating the mask topography of FIG. 1A as an amplitude and a phase according to a frequency.

Hereinafter, aspects of the present invention will be described by explaining preferred embodiments in accordance therewith, with reference to the attached drawings. While describing these embodiments, detailed descriptions of well-known items, functions, or configurations are typically omitted for conciseness. The invention may, however, be embodied in different forms and should not be construed as limited to the embodiments set forth herein. Like reference numerals refer to like elements throughout.

It will be understood that, although the terms first, second, etc. may be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

As an overview of aspects of the present invention, the basic concept of a method of analyzing a mask topography and the concept will be enlarged to obliquely incident light and polarized light. Also, the basic concept and the enlarged concept will be applied to a Hopkins method, a sum of coherent system (SOCS) method, and an Abbe method, which are image formation methods mainly used in design for manufacturability (DFM), or optical proximity correction (OPC), and lithography simulation. For convenience, the following explanation will be made in the order of the basic concept, the application of the basic concept to the image formation methods, and the application of the analysis of a mask topography for the obliquely incident light and polarized light to the image formation methods.

Figure 3:
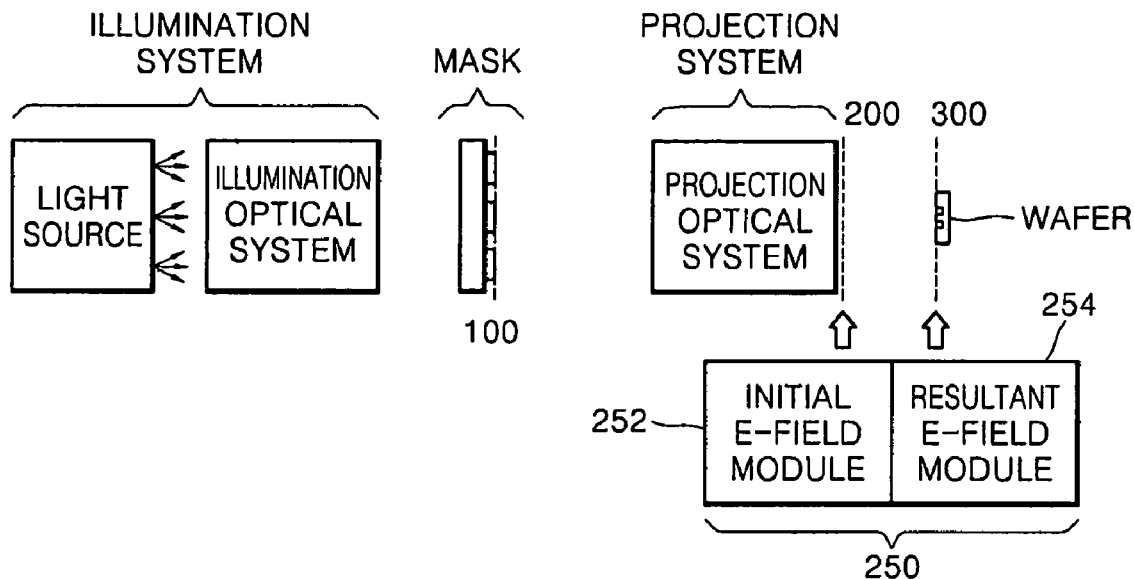
FIG. 3 is a schematic diagram illustrating an embodiment of an optical lithography system configured to implement an analysis method according to an aspect of the present invention.

1. The Basic Concept of an Embodiment of a Method of Analyzing a Mask Topography According to Aspects of the Present Invention:

FIG. 3 is a schematic diagram illustrating an embodiment of an optical lithography system for explaining the basic concept of an embodiment of a method of analyzing a mask topography according to an aspect of the present invention.

Referring to FIG. 3, the optical lithography system includes an illumination system, a mask called a reticle, a projection system, and a wafer onto which a photoresist is applied. The illumination system includes a light source and an illumination optical system, and the projection system includes a projection optical system. A surface of a pattern on the mask facing the projection system is defined as a mask surface 100, a surface of the projection system facing the wafer is defined to be a pupil surface 200 of a projection lens, and a surface of the wafer on which an image is formed is defined as an image surface 300.

An E-field module 250 is configured to implement the analysis method to determine the E-field at the image surface. In this embodiment, the E-field module 250 includes an initial E-field module 252 configured to determine the E-field at the pupil surface of the projection lens. The E-field module 250 also includes a resultant E-field module 254 configured to determine the E-field at the image surface based on the E-fields determined by the initial E-field module 252.

Figure 4:
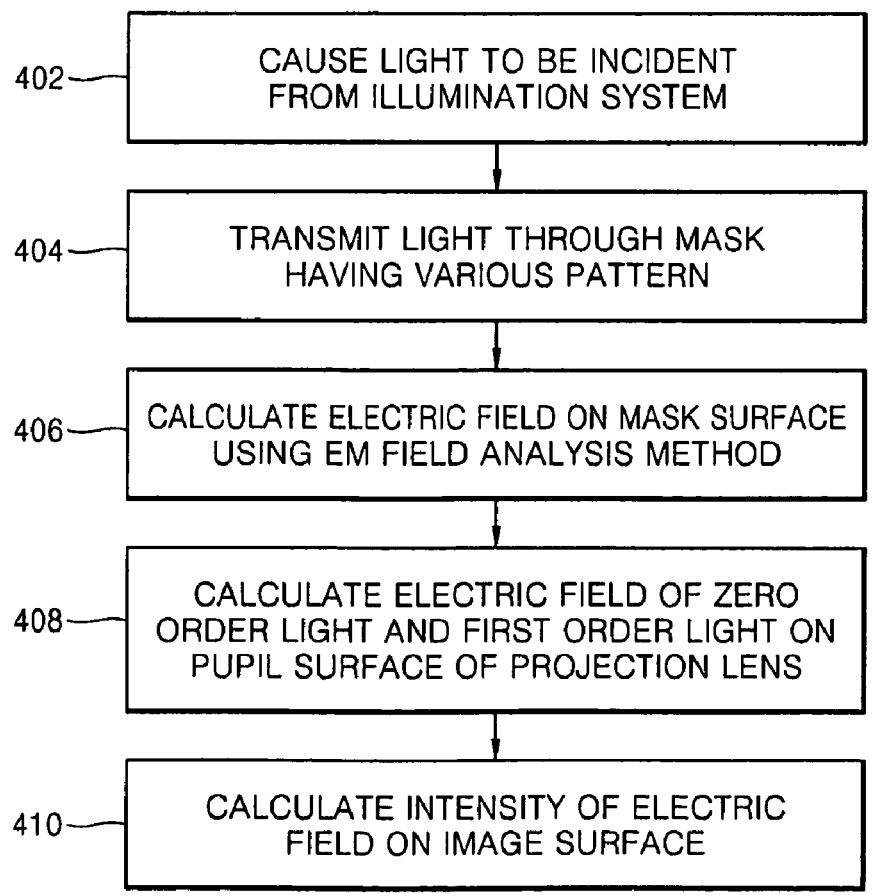
FIG. 4 is a flowchart illustrating an embodiment of EM field analysis method that can be used in the system of FIG. 3.

FIG. 4 is a flowchart for illustrating an embodiment of the basic concept of an electromagnetic (EM) field analysis method used in the analysis method by the E-field module 250 of FIG. 3, according to an aspect of the present invention.

Figure 2A:
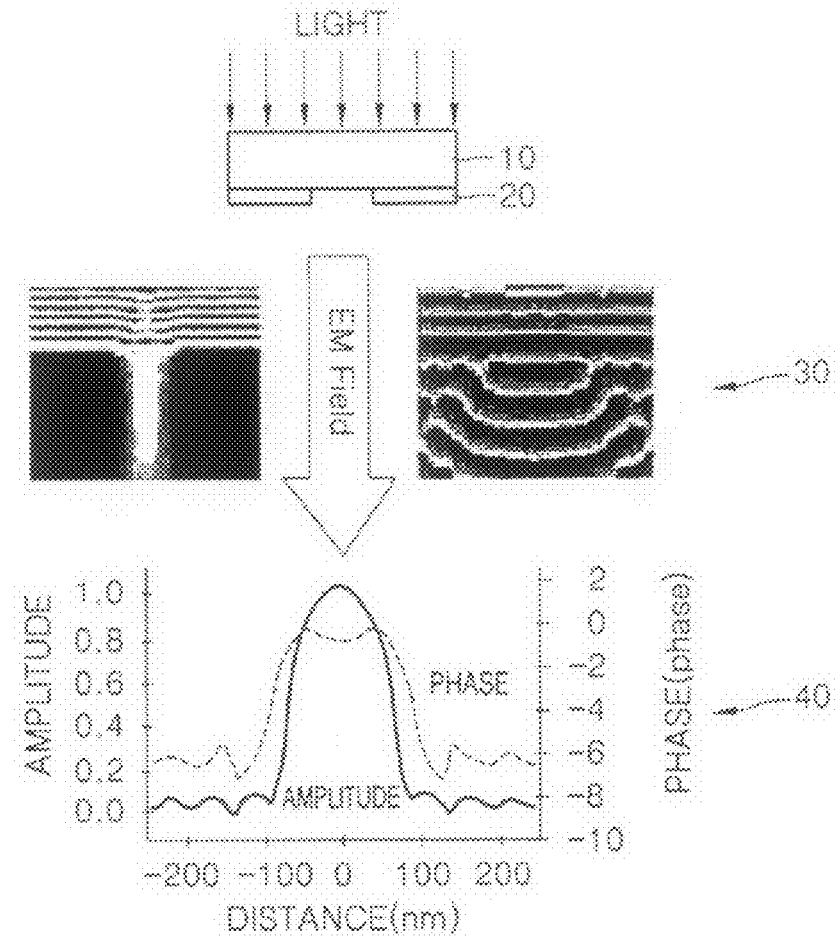
FIG. 2A is a graph illustrating a mask topography of a conventional electromagnetic (EM) field analysis method as an amplitude and a phase according to a distance.
Figure 2B:
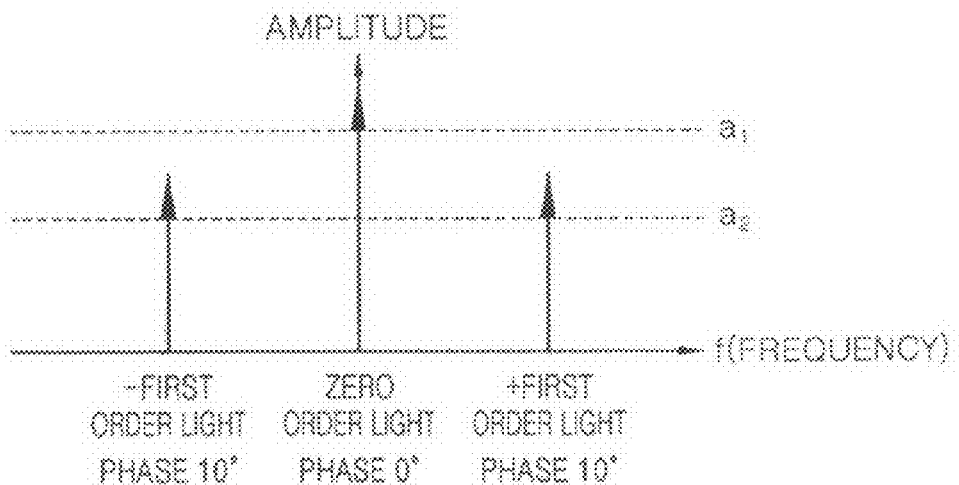
FIG. 2B is a graph illustrating the mask topography of FIG. 2A as an amplitude and a phase according to a frequency.

Referring to FIG. 4, light is made incident on the mask from the optical illumination system in step 402. The light is transmitted through a mask having various patterns, in step 404. When the angle of incidence is small and the aspect ratio of the thickness of the mask to a feature size is low, although there is a change in the transmittance and the phase of an electric field (E-field) on the mask surface 100, the incidence may be assumed to be normal incidence. For example, referring to FIG. 11A, at a portion where amplitude does not vary with incident angle, incidence may be assumed to be normal incident. Also, on the assumption that the incidence is the normal incidence, the illumination system may be taken to be a point light source. In step 406 the E-field is calculated on the mask surface using an EM field analysis method. For example, the EM field analysis method can be of the type already been explained with reference to FIGS. 2A and 2B. That is, a change in amplitude and phase on the mask surface 100 determined by the EM field analysis method is applied to the pupil surface 200 of the projection lens and the image surface 300, in step 408. Here, an E-field incident on the image surface 300 is defined to be $E_F$ and includes calculating the E-field of a zero order light and first order light on the pupil surface of the projection lens. In step 410, the intensity is the E-field on the image surface is calculated.

Figure 5:
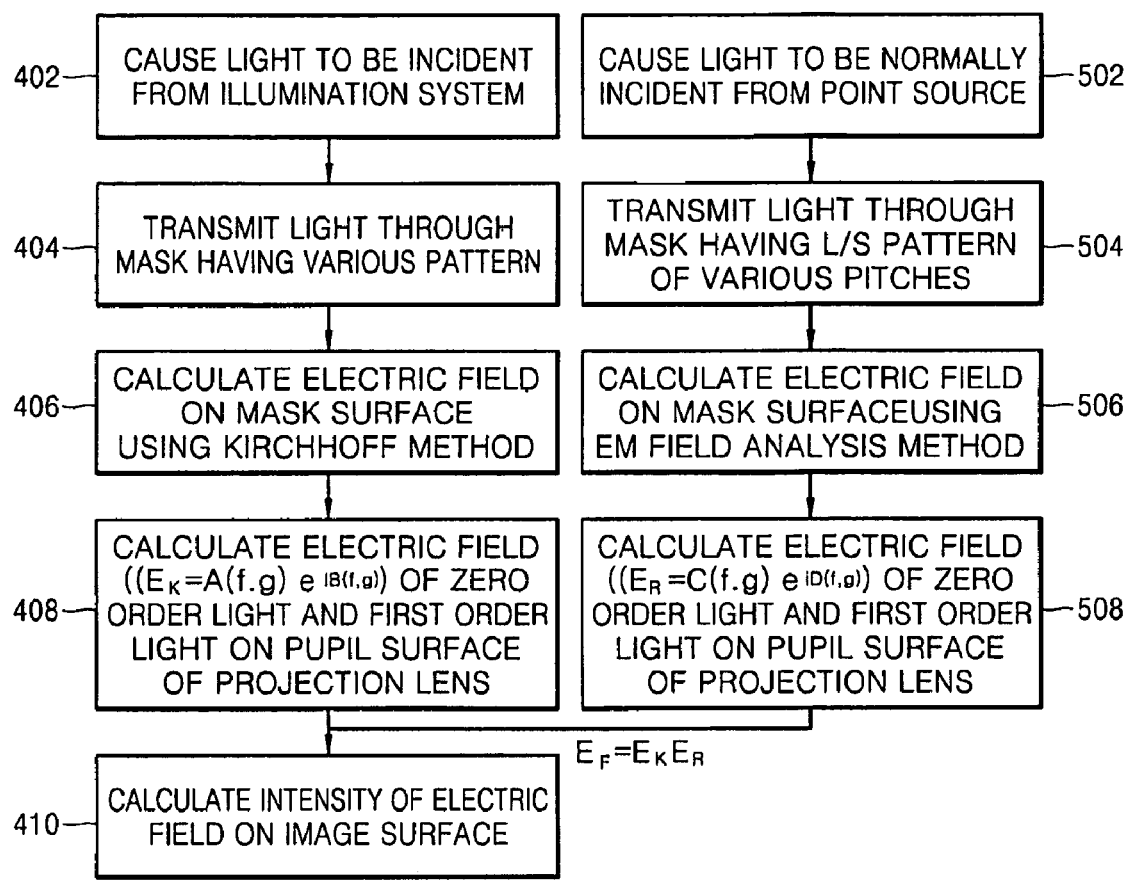
FIG. 5 is a flowchart illustrating an embodiment of a method of analyzing a mask topography according to an aspect of the present invention.

FIG. 5 is a flowchart illustrating an embodiment of a method of analyzing a mask topography including the EM field analysis method of FIG. 4, according to an aspect of the present invention. An E-field to be obtained by using the method according to the present embodiment is an E-field on the pupil surface 200 of the projection lens.

Referring to FIG. 5, the analysis method according to the present embodiment includes simultaneously obtaining an E-field $E_K$ using a Kirchhoff method without considering a pitch of the mask having a pattern of various pitches and shapes, according to the method steps 402, 404, 406, and 408 of FIGS. 4 and 5, and obtaining an E-field $E_R$ using an EM field analysis method considering the pitch in steps 502, 504, 506, and 508 of FIG. 5, and then determining an E-field $E_F$ on the pupil surface 200 of the projection lens by multiplying the E-field $E_K$ and the E-field $E_R$, in step 410.

The determined E-field $E_F$ is incident on the image surface 300. In detail, the E-field $E_K$ obtained without considering the pitch is the E-field of zero order light and first order light on the pupil surface 200 of the projection lens, as in step 408, and the E-field $E_R$ considering the pitch is the E-field of zero order light and first order light on the pupil surface 200 of the projection lens as well, in steps 502, 504, 506, and 508. As in step 402, in step 502 light is made incident on the mask from the illumination source, e.g., as a point source. In step 504, the light is transmitted through a mask having an L/S pattern of various pitches. Here, since the pitch is a pitch of a line and space (L/S) pattern, a calculation time of the EM field analysis method, in step 506, for each pitch can be less than about one (1) minute. And, in step 508, the E-field $E_R$ considering the pitch is the E-field of zero order light and first order light on the pupil surface 200.

Furthermore, in the present embodiment, the E-field $E_R$ considering the pitch is stored in a lookup table and can be referred to when mask topography analysis is performed. The lookup table stores the E-field of zero order light and first order light according to each pitch, and includes a basic format of f, g, amplitude, and phase. The lookup table can be written using Jones and Pauli matrices, which will be explained later. If necessary, the lookup table can be corrected relative to a critical dimension (CD) measured by a typical method known in the art, such as a physical dimension of the mask pattern.

The analysis method according to the present embodiment can ensure the same calculation time as that of the Kirchhoff method and ensure the same calculation accuracy as that of the EM field analysis method. This is especially made possible due to the fact that the E-field $E_R$ considering the pitch can be immediately obtained by referring to the lookup table.

Figure 6:
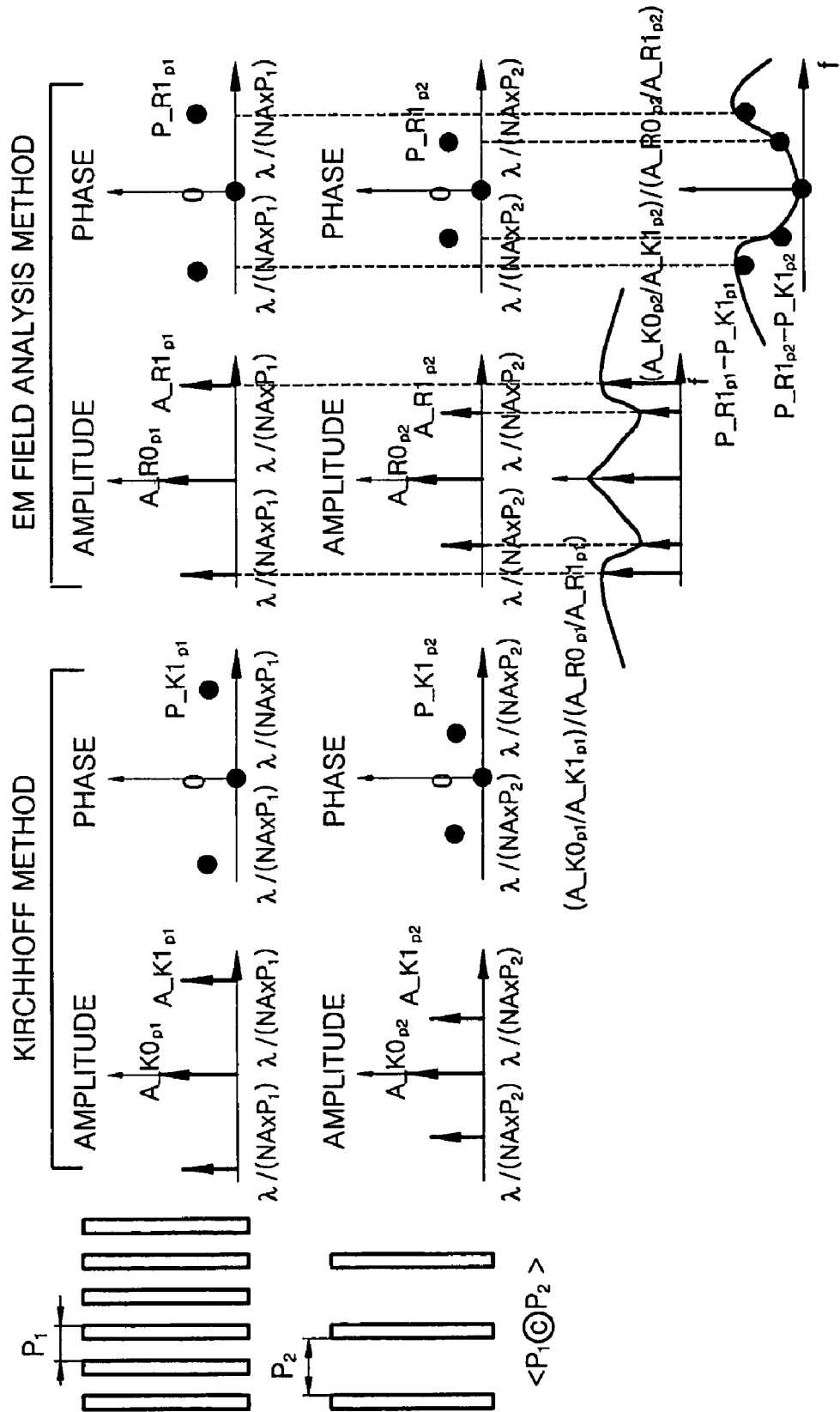
FIG. 6 is a diagram illustrating an embodiment of a method of obtaining an amplitude and a phase according to a frequency to obtain an E-field using an EM field analysis method considering a pitch according to an aspect of the present invention.

FIG. 6 illustrates an embodiment of a method of obtaining amplitude and phase according to frequency to obtain an E-field $E_R$ using an EM field analysis method considering a pitch according to an aspect of the present invention. Here, a first pitch $P_1$ may be less than a second pitch $P_2$. A process of combining, for example, multiplying, amplitudes and phases at the first pitch $P_1$ and the second pitch $P_2$, is <$P_1 \copyright P_2$>. In FIG. 6, A and P respectively denote proportional constants in the amplitude and the phase, K0 and K1 denote constants in the Kirchhoff method, R0 and R1 denote constants in the EM field analysis method, $\lambda$ denotes a wavelength, and NA denotes a numerical aperture.

Referring to FIG. 6, an amplitude and a phase are first obtained by the Kirchhoff method to set an analysis standard in the case of the first pitch $P_1$. In the case of the first pitch $P_1$, amplitudes obtained by the Kirchhoff method are respectively $A\_K0_{P1}$ and $A\_K1_{P1}$ at frequencies of 0 and $\lambda/(NA \times P_1)$. Phases are respectively 0 and $P\_K1_{P1}$ at the same frequencies. Next, an amplitude and a phase are obtained using the EM field analysis method in the case of the first pitch $P_1$. Amplitudes obtained by the EM field analysis method are respectively $A\_R0_{P1}$ and $A\_R1_{P1}$ at frequencies of 0 and $\lambda/(NA \times P_1)$, and phases are respectively 0 and $P\_R1_{P1}$ at the same frequencies.

In the case of the second pitch $P_2$, amplitudes obtained by the Kirchhoff method are respectively $A\_K0_{P2}$ and $A\_K1_{P2}$ at frequencies of 0 and $\lambda/(NA \times P_2)$, and phases are respectively 0 and $P\_K1_{P2}$ at the same frequencies. Next, amplitudes and phases are obtained by the EM field analysis method in the case of the second pitch $P_2$. Amplitudes obtained by the EM field analysis method are respectively $A\_R0_{P2}$ and $A\_R1_{P2}$ at frequencies of 0 and $\lambda/(NA \times P_2)$, and phases are respectively 0 and $P\_R1_{P2}$ at the same frequencies. As shown in FIG. 6, each of an interval between amplitudes and an interval between phases in the case of the second pitch $P_2$ is less than that in the case of the first pitch $P_1$. Next, the amplitudes and the phases calculated in the case of the first pitch $P_1$ and the second pitch $P_2$ are combined together using <P1©P2>, as already mentioned above.

The amplitudes and the phases can be combined together as described above for all pitches, and a desired E-field $E_R$ for each pitch can be easily obtained. When it is difficult to repeat the above process for all of the pitches, amplitudes and phases with respect to selected pitches may be calculated and amplitudes and phases according to frequencies for all of the pitches may be determined based on the calculated amplitudes and phases. The amplitudes and the phases for the respective pitches may be stored in the lookup table.

Figure 7A:
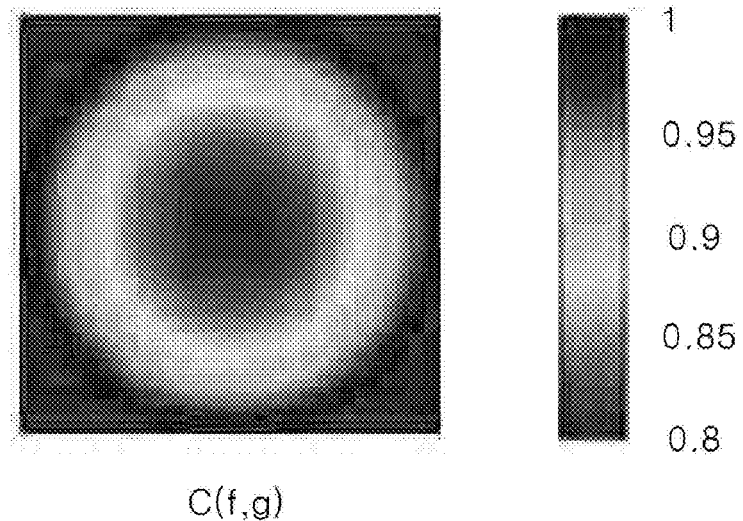
FIG. 7A is a photograph illustrating an amplitude along an f-axis and a g-axis in a frequency domain.
Figure 7B:
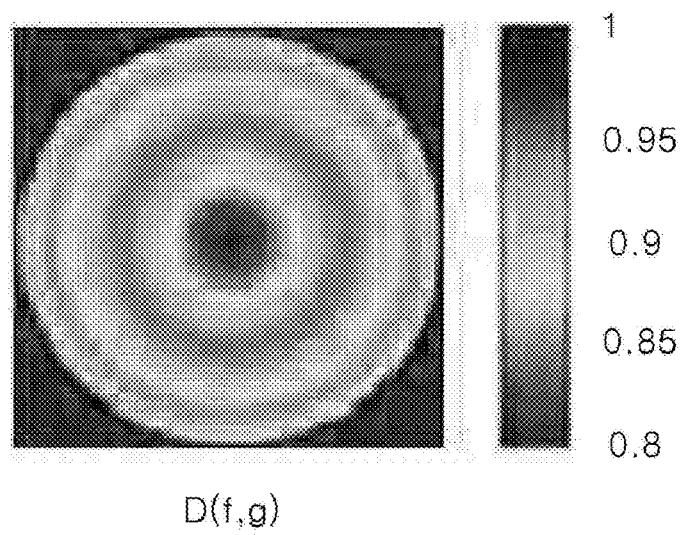
FIG. 7B is a photograph illustrating a phase along an f-axis and a g-axis in a frequency domain.

FIG. 7A is an image illustrating amplitude along an f-axis and a g-axis in a frequency domain, represented by C(f,g) in FIG. 5. FIG. 7B is an image illustrating phase, represented by D(f,g) in FIG. 5. Referring to FIGS. 7A and 7B, amplitude and phase on a f-g plane are respectively extracted by rotating an amplitude and a phase, which are calculated as described above, along the f-axis (g=0) in the frequency domain by 360° and radially symmetrizing the rotated amplitude and phase.

Meanwhile, the projection lens has a cut-off frequency. The cut-off frequency is determined by the numerical aperture (NA) of the projection lens and the wavelength of light. Accordingly, the E-field $E_R$ is calculated only for f and g in the ranges of $-2NA/\lambda \leq f \leq 2NA/\lambda$ and $-2NA/\lambda \leq g \leq 2NA/\lambda$.

2. The Application of the Basic Concept to Image Formation Methods:

1) The Application of the Basic Concept to a Hopkins Method:

The intensity of an E-field used in the Hopkins method is expressed by Equations 1 through 3 herein. Here, I(x, y) is the intensity of an E-field on the image surface 300 (see FIG. 3), O(f, g) is the intensity of an E-field on the pupil surface 200 of the projection lens (see FIG. 3), and TCC(f, g, f', g') is a transmission cross coefficient between the illumination system and the pupil surface 200 of the projection lens as is well known.

$$I(x,y)=\iint O(f,g)e^{-2\pi i(fx+gy)}df dg \quad \text{Equation (1)}$$

$$O(f,g)=\iint F(f,g)F^*(f+f',g+g')df'dg' \iint TCC(f,g;f',g')df'dg' \quad \text{Equation (2)}$$

$$Tcc(f,g,f',g')=\iint J(f'',g'')K(f+f'',g+g'')K^*(f+f'+f'',g+g'+g'')df''dg'' \quad \text{Equation (3)}$$

where F denotes the Fourier transform of the mask pattern, J denotes the illumination system, and K denotes the projection lens. The Hopkins method obtains the intensity of an E-field O(f,g) by multiplying the integral of the Fourier transform of the mask pattern and the integral of TCC determined by the illumination system and the projection lens and then integrating the multiplication result in the frequency domain. F(f, g) in Equation 2 corresponds to $E_F$(f, g) of FIG. 5. Accordingly, Equation 4 results from substitution of $E_F$(f, g)=$E_K$(f, g)$E_R$(F, g) into Equation 2.

$$O(f,g)=\iint E_k(f,g)E^*_k(f+f',g+g')df'dg' \iint E_R(f,g)E^*_R(f+f',g+g')df'dg' \iint TCC(f,g;f',g')df'dg' \quad \text{Equation (4)}$$

Referring to Equation 4, O(f, g) is obtained by additionally calculating only $E_R = \iint E_R(f,g)E^*_R(f+f', g+g')df'dg'$ and combining the result to the result calculated by the conventional Kirchhoff method. Since the additionally calculated value can be obtained by referring to the lookup table, a calculation speed is the same as that of the conventional Kirchhoff method. Also, since information obtained by the EM field analysis method is used from the lookup table, a mask topography effect can be accurately obtained.

2) The Application of the Basic Concept to an SOCS Method:

An SOCS method calculates the intensity of an E-field by developing the O(f,g) of the Hopkins method in the form of the sum of kernels φ as shown in Equation 5 and convoluting the same with a mask pattern within an optical diameter (ambit) as shown in Equation 6. In FIGS. 5 and 6, φ denotes the kernel and M denotes the mask pattern.

$$TCC = \sum \lambda_k \Phi_k(\vec{x})\Phi^*_k(\vec{x}') \quad \text{Equation (5)}$$

$$I(x, y) = \sum_{k=1}^{N} \sigma_k |\Phi_k \otimes M(x, y)|^2 \quad \text{Equation (6)}$$

Since an E-field $E_R$ introduced by the present embodiment is not changed although a peripheral pattern like the kernel is changed, the E-field $E_R$ can be stored in the lookup table. The intensity of the E-field $E_R$ is calculated by extracting a new TCC($TCC_{new}$) including an E-field $E_R$ from the existing TCC in the O(f,g) of Equation 4 and developing the extraction result in the form of the sum of kernels φ as shown in FIG. 7.

$$O(f,g)=\iint E_k(f,g)E^*_k(f+f',g+g')df'dg' \iint TCC_{new}(f,g;f',g')df'dg' \quad \text{Equation (7)}$$

Here, the $TCC_{new}$(f,g, f', g') is defined by:

$$TCC_{new}(f,g;f',g')=E_R(f,g)E^*_R(f+f',g+g')TCC(f,g;f',g')=\Sigma\lambda_k\Phi(\vec{x})\Phi^*_k(\vec{x}')$$

Accordingly, a mask topography effect can be calculated by transforming the kernel calculated by the Kirchhoff method into the new TCC ($TCC_{new}$).

Figure 8A:
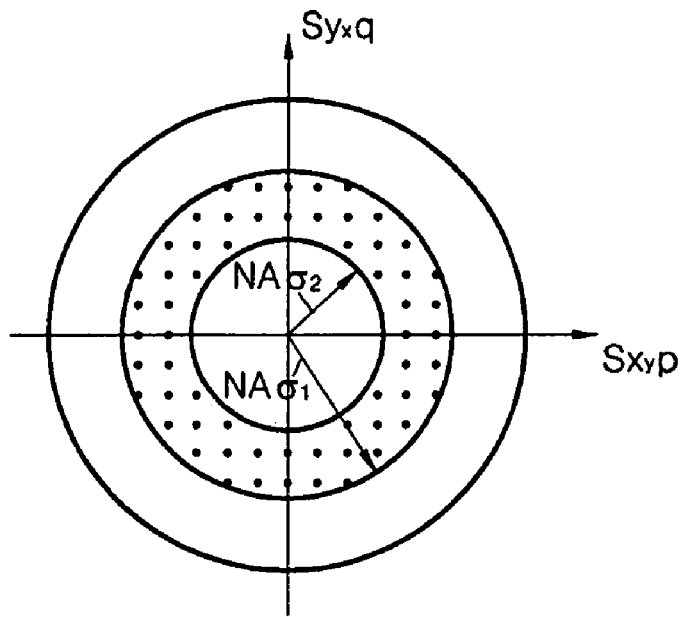
FIG. 8A illustrates an annular illumination using the Abbe method, in accordance with aspects of the present invention.
Figure 8B:
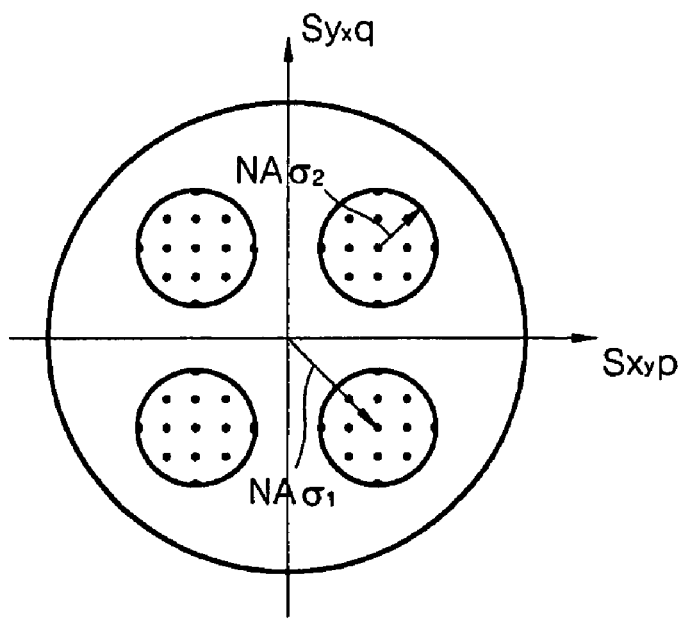
FIG. 8B illustrates a quadruple illumination using the Abbe method, in accordance with aspects of the present invention.

3) The Application of the Basic Concept to an Abbe Method:

FIGS. 8A and 8B illustrate exemplary illumination methods of the Abbe method, wherein the basic Abbe method is known in the art. FIG. 8A illustrates an annular illumination method, and FIG. 8B illustrates a quadruple illumination method.

Referring to FIGS. 8A and 8B, points indicate point light sources. Equation 8 shows an approach for determining an intensity of the E-field for each point source, denoted as $I_{image}$, on the image surface 300 (see FIG. 3). That is, $I_{source}$ denotes the time-averaged intensity of each point light source, and $E_{image}$ denotes an E-field on the image surface 300 by each point light source.

$$I_{image}(x', y', z') = \int_{p_x^2+p_y^2 \leq NA_c^2} \int I_{source}(p_x, p_y) E_{image}(x', y'; p_x, p_y) \cdot E^*_{image}(x', y'; p_x, p_y) dp_x dp_y \quad \text{Equation (8)}$$

Figure 9:
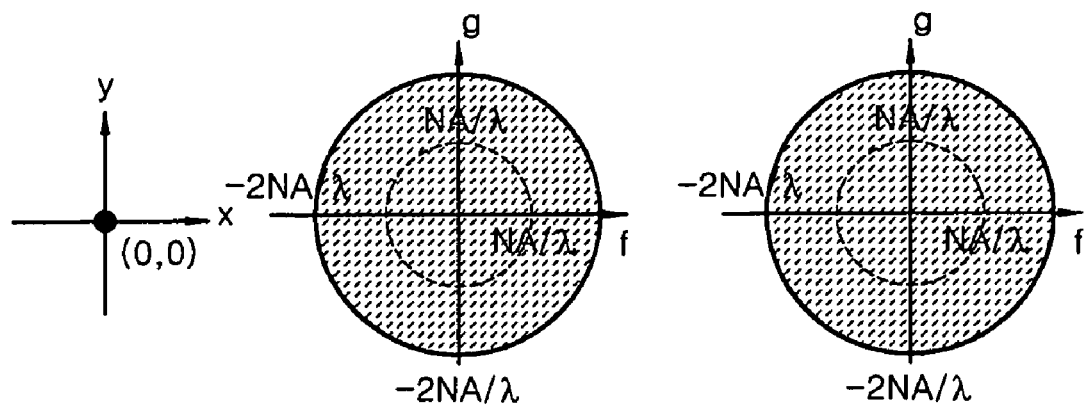
FIG. 9 illustrates an intensity in the case of a normally incident point light source at coordinates (0, 0), which is calculated by the Abbe method.

FIG. 9 illustrates an intensity in the case of a normally incident point light source at coordinates (0, 0), which is calculated by the Abbe method. In the first figure, an outer circle (solid line) is $E_K$ of the point light source, and an inner circle (dotted line) is $E_K$ on the pupil surface of the projection lens of FIG. 5. In the second figure, an outer circle (solid line) denotes $E_R$ of the point light source, and an inner circle (dotted line) denotes $E_R$ on the pupil surface of the projection lens of FIG. 5. That is, an E-field using the Abbe method can be calculated by transforming the illumination system used in calculating $E_K$ in FIG. 5 into the normally incident point light source.

Figure 10:
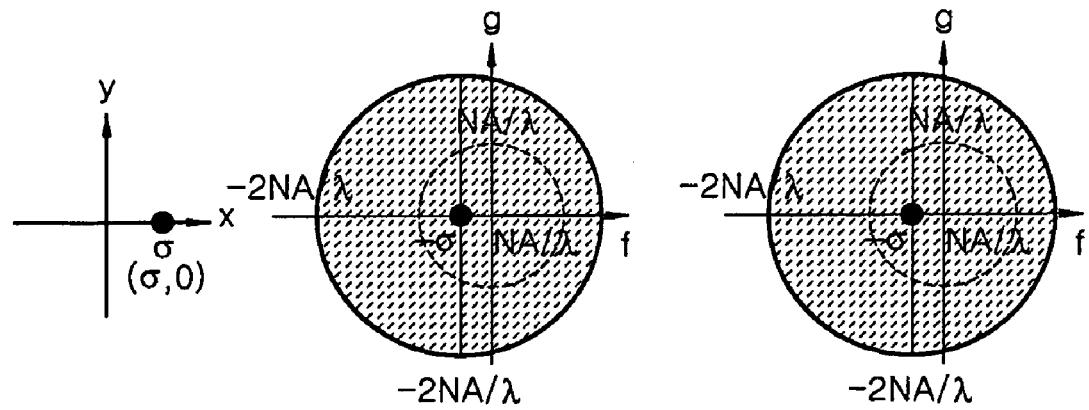
FIG. 10 illustrates an intensity in the case of an obliquely incident point light source at coordinates ($\sigma$, 0), which is calculated by the Abbe method.

FIG. 10 illustrates an intensity in the case of obliquely incident point light source at coordinates (σ, 0), which is calculated by the Abbe method. In the first figure, an outer circle (solid line) denotes $E_K$ of the point light source, and an inner circle (dotted line) denotes $E_K$ on the pupil surface of the projection lens of FIG. 5. In the second figure, an outer circle (solid line) denotes $E_R$ of the point light source and an inner circle (dotted line) denotes $E_R$ on the pupil surface of the projection lens of FIG. 5.

As shown in FIGS. 9 and 10, $E_K$ and $E_R$ of the obliquely incident point light source are obtained by shifting $E_K$ and $E_R$ of FIG. 9 by $(-\sigma,0)$. In this case, the same result can be obtained by calculating $E_F(f,g)=E_K(f,g)E_R(f,g)$ using $E_K$ and $E_R$ of FIG. 9, and shifting $E_F$ by $(-\sigma,0)$.

The intensity of an E-field considering a mask topography effect can be calculated by repeating the above process for all of the point light sources in the illumination system.

3. Mask Topography Analysis for Oblique Incidence:

The basic concept and the application of the basic concept to the image formation methods are based on the assumption that when an aspect ratio is low and the angle of oblique incidence is small enough not to affect an amplitude, a change in the transmittance and the phase of an E-field on the mask surface due to the oblique incidence is similar to that in the case of normal incidence, whereas when an aspect ratio is substantially high and the angle of oblique incidence is high enough to affect an amplitude, compensation for a mask topography effect is necessary.

Figure 11A:
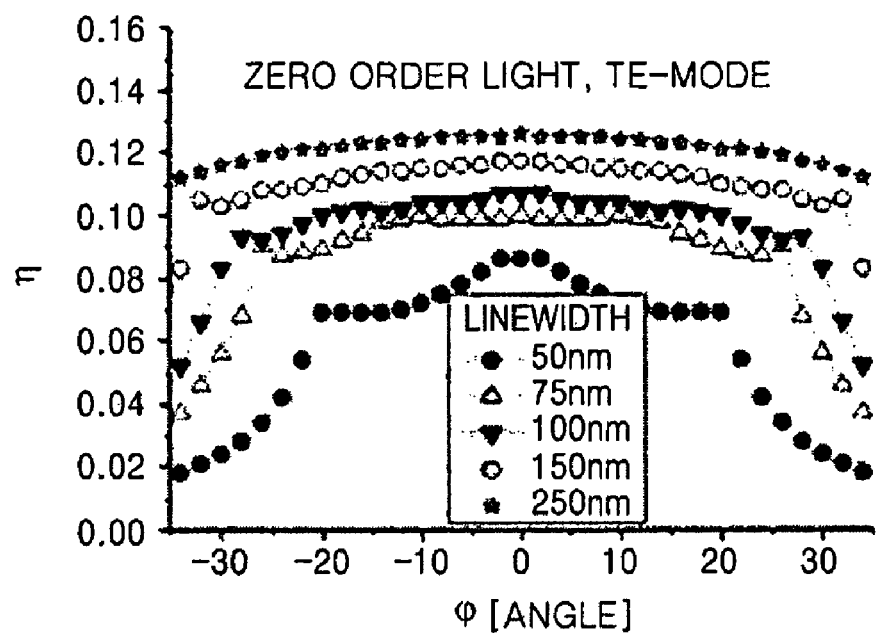
FIGS. 11A and 11B are graphs illustrating transmittance variations of zero order light and first order light according to normal incidence and oblique incidence in a TE-mode and a TM mode, respectively.
Figure 11A:
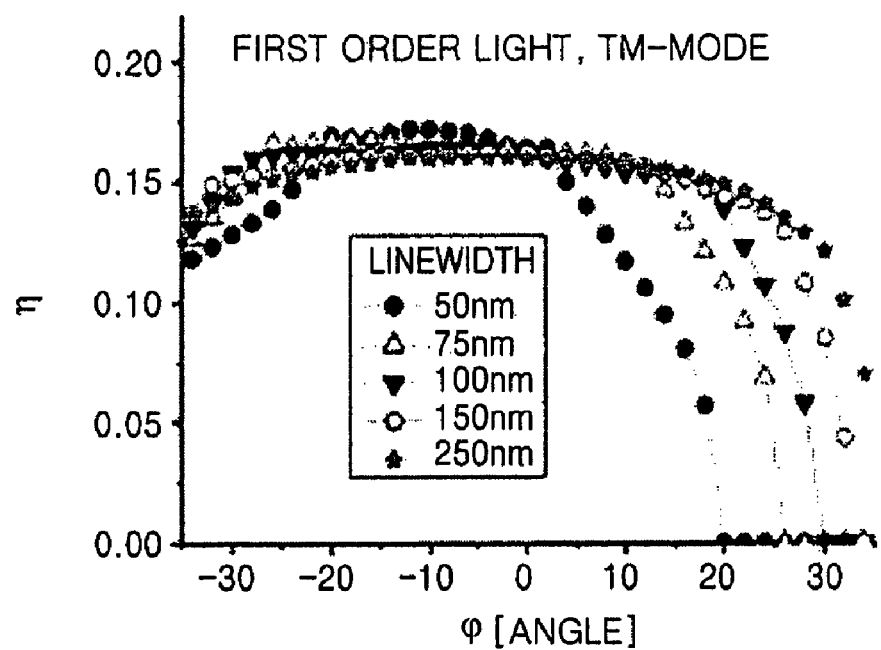
Figure 11B:
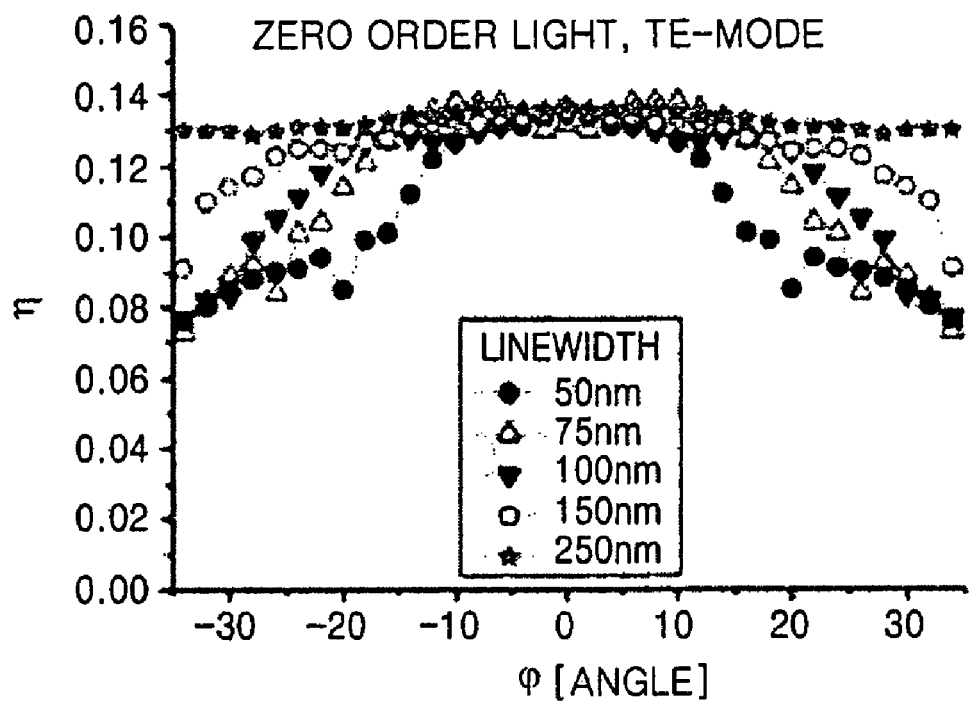
Figure 11B:
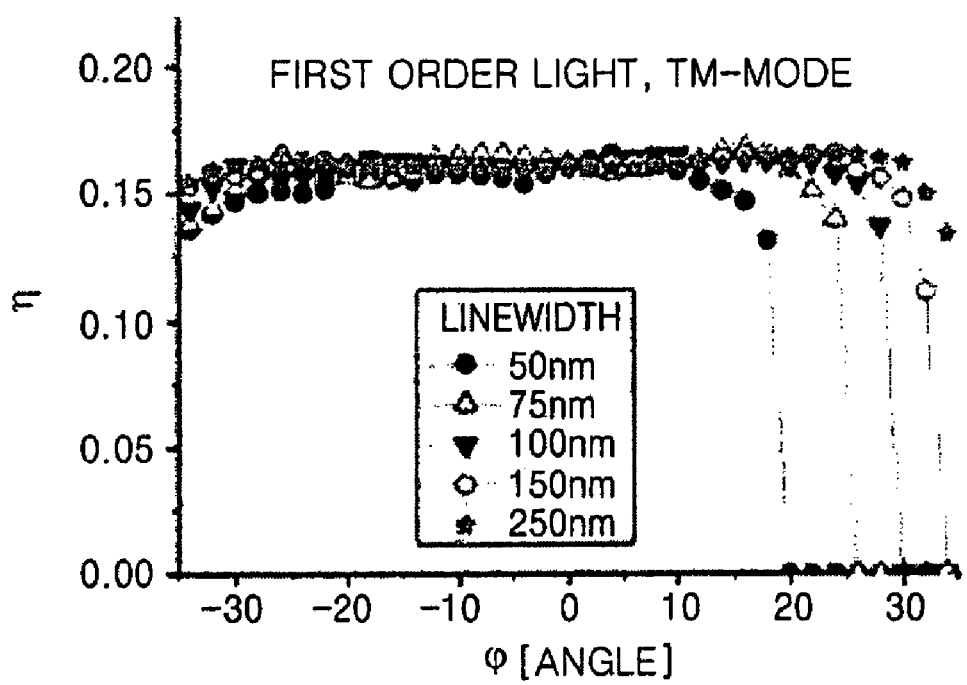

FIGS. 11A and 11B are graphs illustrating transmittance variations η of zero order light and first order light according to normal incidence and oblique incidence in a TE-mode and a TM-mode, respectively. Here, the transmittance variation η is a ratio between an amplitude at a light source and an amplitude on the pupil surface of the projection lens. Here, in this example, the light blocking layers are formed of MoSi, and the wavelength of incident light is 193 nm.

Referring to FIGS. 11A and 11B, when a change in the transmittance and the phase of an E-field on the mask surface due to oblique incidence is different from that in the case of normal incidence, the E-field of zero order light and first order light on the pupil surface of the projection lens having the L/S pattern of various pitches is calculated for each of the oblique incidence and the normal incidence using the EM field analysis method of FIG. 5. Next, $E_R$ of FIG. 9 is replaced by the E-field in the case of the normal incidence and $E_R$ of FIG. 10 is replaced by the E-field in the case of the oblique incidence.

4. Mask Topography Analysis for Polarized Light:

When incident light is polarized light, $E_R$ is calculated for each of TE and TM elements using the EM field analysis method of FIG. 5, and then is applied to a chosen image formation method, such as the Hopkins method, the SOCS method, or the Abbe method, as examples. An E-field on an xyz plane can be calculated by resolving $E_R$ calculated for each of the TE and TM mode elements into vectors of the xyz plane based on Equations of FIG. 12.

$E_F$ of FIG. 5 may be developed in the form of a multiplication between $E_R$ and a Jones matrix of FIG. 13 or a Pauli matrix of FIG. 14, wherein a Jones matrix and a Pauli matrix are generally known in the art. That is, an E-field E' on the pupil surface of the projection lens can be expressed as the multiplication between $E_R$ and the Jones matrix or Pauli matrix. In the Jones matrix, $J_{xx}$ denotes an X-direction element of $E_R$, $J_{yy}$ denotes a Y-direction element of $E_R$, and $J_{xy}=J_{yx}=0$. Also, $E_x$ and $E_y$ are $E_R$ elements. The Pauli matrix is obtained by developing the Jones matrix. Based on the Jones matrix, $\sigma_0$ denotes a state which is not polarized, $\sigma_1$ denotes a state that is linearly polarized in the X or Y direction, $\sigma_2$ denotes a state that is linearly polarized at +45° or −45°, and $\sigma_3$ denotes a state that is left or right circularly polarized.

As described above, since the system and method for analyzing a mask topography according to aspects of the present invention simultaneously obtains the E-field $E_K$ using the Kirchhoff method without considering the pitch and obtains the E-field $E_R$ using the EM field analysis method, and then determines the E-field $E_F$ on the pupil surface of the projection lens by combining the E-field $E_K$ and the E-field $E_R$, the same calculation time as that of the Kirchhoff method can be ensured and the same calculation accuracy as that of the EM field analysis method can be ensured.

Furthermore, since the analysis method according to aspects of the present invention applies the E-field $E_R$ to a generic image formation method, such as the Hopkins method, the SOCS method, or the Abbe method, substantially the same calculation time as that of the Kirchhoff method can be ensured and substantially the same calculation accuracy as that of the EM field analysis method can be ensured.

Moreover, since the analysis method according to aspects of the present invention uses the E-field $E_R$ even in the case of oblique incidence and polarized light, substantially the same calculation time as that of the Kirchhoff method can be ensured and substantially the same calculation accuracy as that of the EM field analysis method can be ensured.

While aspects of the present invention have been particularly shown and described with reference to exemplary embodiments thereof, it will be understood by those of ordinary skill in the art that various changes in form and details may be made therein without departing from the spirit and scope of the present invention as defined by the following claims. It is intended by the following claims to claim that which is literally described and all equivalents thereto, including all modifications and variations that fall within the scope of each claim.

What is claimed is:

1. A system for analyzing a mask topography, where an illumination system is configured to transmit light incident on a mask, wherein light passes through the mask to a projection system having a projection lens configured to transmit light to an image surface of a wafer, the system comprising a set of modules embodied in a tangible device and executable by at least one processor, the set of modules comprising:

an initial E-field module configured to determine a first electric field on a mask surface of the mask using a Kirchhoff method, independent of a pitch formed on the mask, and to determine a second electric field on a pupil surface of the projection lens using an electromagnetic field analysis method dependent on the pitch; and a resultant E-field module configured to determine a third electric field on the image surface of the wafer as a combination of the first electric field and the second electric field, wherein the initial E-field module is configured to determine the second electric field for each of a plurality of pitches, to obtain amplitudes and phases for the plurality of pitches, and, if amplitudes and phases cannot be obtained for one or more pitches, to determine the amplitudes and phases for the one or more pitches based on the amplitudes and phases for the other pitches.

2. The system of claim 1, wherein the initial E-field module is configured to determine the second electric field based on the illumination system comprising a normally incident point light source.

3. The system of claim 1, wherein, when an angle of incidence of the incident light is small enough not to affect an amplitude and the aspect ratio of a mask thickness to a feature size is low, the initial E-field module is configured to determine the second electric field based on an assumption that the incidence is a normal incidence.

4. The system of claim 1, wherein, when an angle of incidence of the incident light is large enough to affect an amplitude and the aspect ratio of a mask thickness to a feature size is high, the initial E-field module is configured to determine the second electric field based on the assumption that the incidence is an oblique incidence.

5. A system for analyzing a mask topography, where an illumination system is configured to transmit light incident on a mask, wherein light passes through the mask to a projection system having a projection lens configured to transmit light to an image surface of a wafer, the system comprising a set of modules embodied in a tangible device and executable by at least one processor, the set of modules comprising:
  an initial E-field module configured to determine a first electric field on a mask surface of the mask using a Kirchhoff method, independent of a pitch formed on the mask, and to determine a second electric field on a pupil surface of the projection lens using an electromagnetic field analysis method dependent on the pitch; and
  a resultant E-field module configured to determine a third electric field on the image surface of the wafer as a combination of the first electric field and the second electric field,
  wherein, when an angle of incidence of the incident light is large enough to affect an amplitude and the aspect ratio of a mask thickness to a feature size is high, the initial E-field module is configured to determine the second electric field based on the assumption that the incidence is an oblique incidence, and
  wherein the initial E-field module is configured to:
  determine the second electric field based on an assumption that the oblique incidence is normal incidence; and
  determine the second electric field in the case of the oblique incidence by shifting the second electric field in the case of normal incidence according to a predetermined frequency.

6. The system of claim 1, wherein the resultant E-field module is configured to determine the third electric field by multiplying the second electric field by a Jones matrix or a Pauli matrix when the incident light is polarized light.

7. The system of claim 1, wherein the initial E-field module is configured to determine the second electric field as the electric field of zero order light and first order light on the pupil surface of the projection lens.

8. The system of claim 1, wherein the pitch is the pitch of a line and space pattern of the mask.

9. The system of claim 1, wherein the initial E-field module is configured to determine the second electric field for each of a plurality of pitches and to store the second electric field in a lookup table according to each pitch.

10. The system of claim 9, wherein:
  the initial E-field module is configured to determine the second electric field at each pitch as the electric field of zero order light and first order light on the pupil surface of the projection lens, and
  wherein the lookup table is configured to store the second electric fields of the zero order light and the first order light according to each pitch, and includes a basic format of f, g, amplitude, and phase.

11. The system of claim 9, wherein the lookup table is written using Jones and Pauli matrices.

12. A system for analyzing a mask topography, where an illumination system is configured to transmit light incident on a mask, wherein light passes through the mask to a projection system having a projection lens configured to transmit light to an image surface of a wafer, the system comprising a set of modules embodied in a tangible device and executable by at least one processor, the set of modules comprising:
  an initial E-field module configured to determine a first electric field on a mask surface of the mask using a Kirchhoff method, independent of a pitch formed on the mask, and to determine a second electric field on a pupil surface of the projection lens using an electromagnetic field analysis method dependent on the pitch; and
  a resultant E-field module configured to determine a third electric field on the image surface of the wafer as a combination of the first electric field and the second electric field,
  wherein the initial E-field module is configured to determine the second electric field for each of a plurality of pitches and to store the second electric field in a lookup table according to each pitch, and
  wherein the lookup table is corrected with respect to a critical dimension.

13. The system of claim 1, wherein the initial E-field module is configured to determine an electric field for each of a plurality of pitches by obtaining an amplitude and a phase using a Kirchhoff method for each pitch, and to obtain an amplitude and a phase of the second electric field using an electromagnetic field analysis method with the amplitudes and a phases determined for each pitch.

14. The system of claim 1, wherein the initial E-field module is configured to determine the second electric field within a cut-off frequency range of the projection lens.

* * * * *